US009660856B2

(12) United States Patent
Myers

(10) Patent No.: US 9,660,856 B2
(45) Date of Patent: May 23, 2017

(54) DISTORTION COMPENSATION CIRCUIT

(71) Applicant: Linear Technology Corporation, Milpitas, CA (US)

(72) Inventor: John Perry Myers, Fremont, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 14/806,492

(22) Filed: Jul. 22, 2015

(65) Prior Publication Data
US 2016/0248617 A1    Aug. 25, 2016

Related U.S. Application Data

(60) Provisional application No. 62/120,711, filed on Feb. 25, 2015, provisional application No. 62/134,389, filed on Mar. 17, 2015.

(51) Int. Cl.
*H04L 25/03* (2006.01)
*H04L 27/36* (2006.01)
(Continued)

(52) U.S. Cl.
CPC ........... *H04L 27/364* (2013.01); *H03D 3/009* (2013.01); *H03F 1/3211* (2013.01);
(Continued)

(58) Field of Classification Search
CPC ................. H04L 27/364; H04L 27/368; H04L 25/03343; H03F 1/3247; H03F 1/3211;
(Continued)

(56) References Cited

U.S. PATENT DOCUMENTS 7,876,867 B2    1/2011  Filipovic et al.
8,050,649 B2   11/2011  Chen et al.
(Continued)

OTHER PUBLICATIONS

Rahkonen et al., "Performance of an Integrated 2.1 GHz Analog Predistorter," Integrated Nonlinear Microwave and Millimeter-Wave Circuits, 2006, International Workshop On, IEEE, PI, Jan. 31, 2006 (Jan. 31, 2006), pp. 34-37, XP031009424, ISBN: 978-0-7803-9722-4.

(Continued)

*Primary Examiner* — Janice Tieu
(74) *Attorney, Agent, or Firm* — IntelleTek Law Group, PLLC

(57) ABSTRACT

A method and system of compensating for distortion in a baseband in-phase (I) and a corresponding baseband quadrature (Q) signal. The circuit includes an in-phase I attenuator configured to attenuate the baseband in-phase I signal and an in-phase Q attenuator configured to attenuate the baseband Q signal. There are one or more circuits that are configured to receive the attenuated in-phase I signal and the attenuated baseband Q signal. Each circuit performs a different calculation based on predetermined equations configured to determine the IM2, HD2@0°, HD2@90°, IM3@0°, IM3@90°, HD3@0°, and HD3@90°. The distortion compensation circuit is configured to use the result of at least one of the calculation circuits to generate I and Q distortion compensation signals.

20 Claims, 8 Drawing Sheets

(51) Int. Cl.
*H03F 1/32* (2006.01)
*H04B 3/32* (2006.01)
*H03D 3/00* (2006.01)
*H03F 3/45* (2006.01)
*H04B 1/10* (2006.01)

(52) U.S. Cl.
CPC .......... *H03F 1/3247* (2013.01); *H03F 3/4508* (2013.01); *H03F 3/45475* (2013.01); *H04B 1/1036* (2013.01); *H04B 3/32* (2013.01); *H04L 25/03343* (2013.01); *H04L 27/368* (2013.01); *H03C 2200/0083* (2013.01); *H03D 2200/0088* (2013.01)

(58) Field of Classification Search
CPC ..... H03F 3/4508; H03F 3/45475; H04B 3/32; H04B 1/1036; H03D 3/009; H03D 2200/0088; H03C 2200/0083
USPC .................................................. 375/296, 285
See application file for complete search history.

(56) References Cited

U.S. PATENT DOCUMENTS

| | | | |
|---|---|---|---|
| 8,483,646 | B2 | 7/2013 | Myers |
| 8,848,824 | B2 | 9/2014 | Teetzel |
| 2005/0068102 | A1 | 3/2005 | Hongo et al. |
| 2005/0163252 | A1 | 7/2005 | McCallister et al. |
| 2006/0135112 | A1* | 6/2006 | Matsumoto .............. H04B 1/10 455/334 |
| 2008/0030269 | A1 | 2/2008 | Tsuda et al. |
| 2008/0039045 | A1* | 2/2008 | Filipovic ................ H04B 1/109 455/295 |
| 2009/0264089 | A1* | 10/2009 | Suzuki .................. H03F 1/3252 455/114.3 |
| 2015/0146820 | A1* | 5/2015 | Winiecki .............. H03F 1/3258 375/296 |

OTHER PUBLICATIONS

Extended European Search Report for EP Application No. 16000320.8 dated Oct. 17, 2015 (12 pages).

* cited by examiner

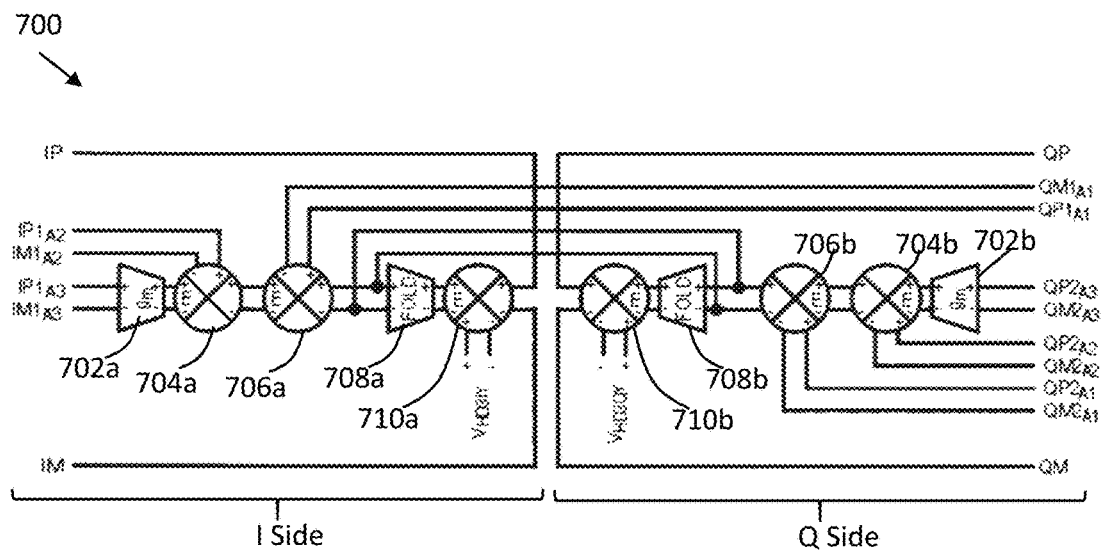
FIG. 7
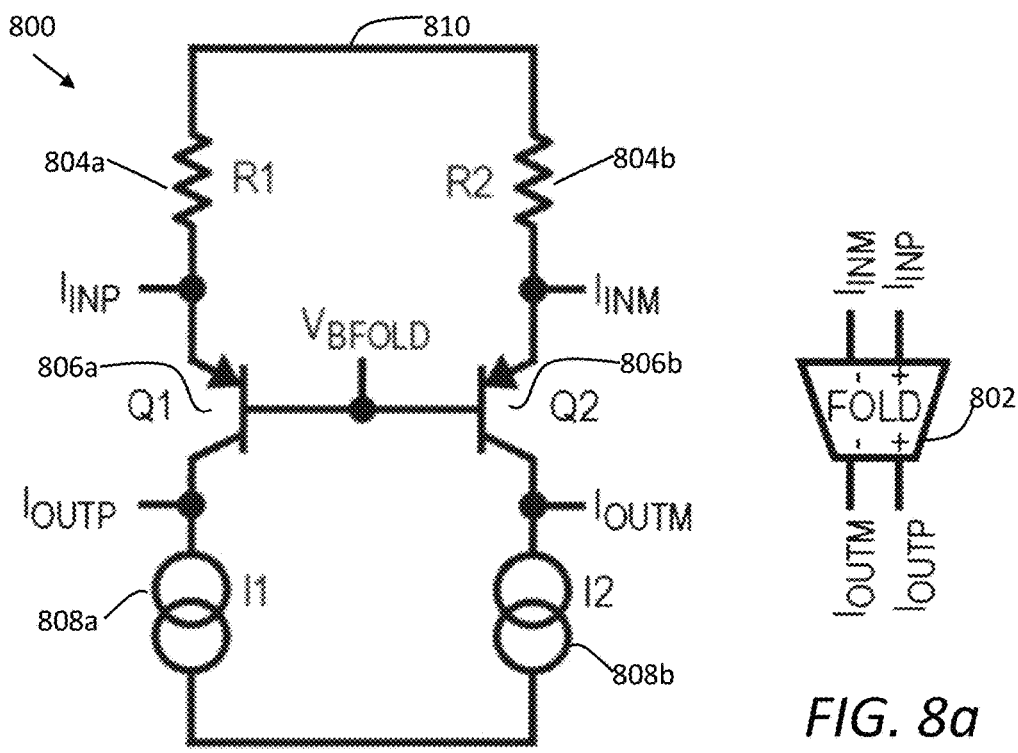
FIG. 8a
FIG. 8b

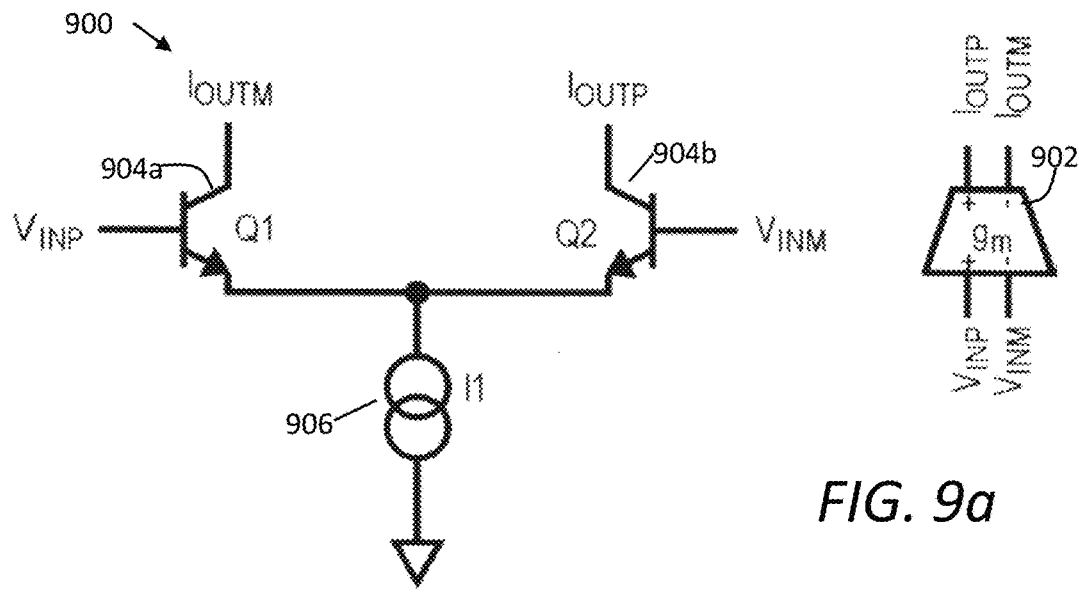
FIG. 9a
FIG. 9b
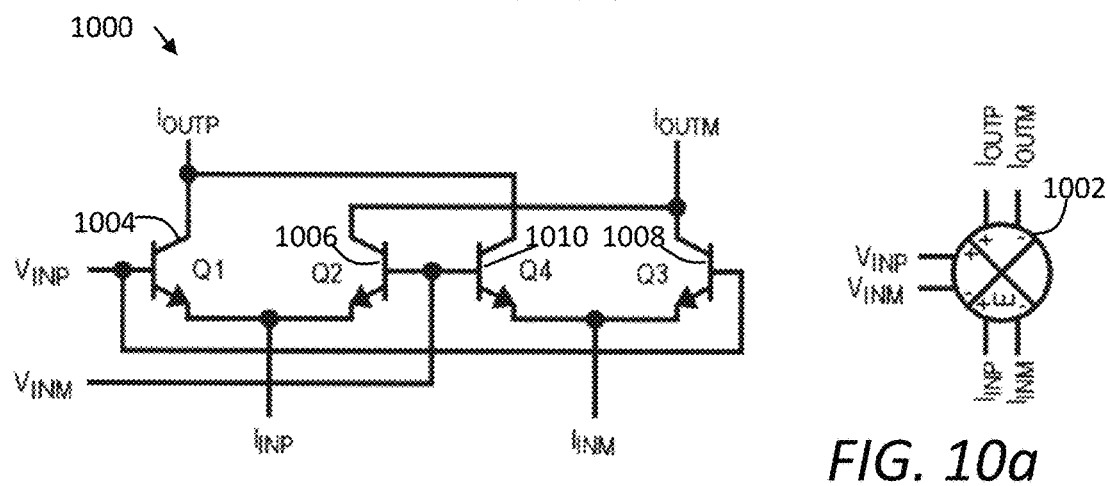
FIG. 10a
FIG. 10b

DISTORTION COMPENSATION CIRCUIT

CROSS REFERENCES TO RELATED APPLICATIONS

The present application claims the benefit of priority under 35 U.S.C. §119 from U.S. Provisional Patent Application Ser. No. 62/120,711, entitled "Distortion Compensation Circuit," filed on Feb. 25, 2015, and from U.S. Provisional Patent Application Ser. No. 62/134,389, entitled "Distortion Compensation Circuit," filed on Mar. 17, 2015, which are hereby incorporated by reference in its entirety for all purposes.

BACKGROUND

Technical Field

This disclosure generally relates to distortion compensation, and more particularly to circuits and methods for correcting distortion for in phase and quadrature component signals.

Description of Related Art

Communication systems include various circuits, such as receiver demodulators and baseband amplifiers, which have nonlinearities that may lead to "unwanted signals." The nonlinear behavior of such circuits induces intermodulation products that, together with the system noise, increase the amount of signal distortion, thereby lowering the system performance. Unwanted signals that occur at multiples of the input frequency are referred to as harmonic distortion (HD). Unwanted signals that occur at frequencies that are linear combinations of the input frequencies are referred to as intermodulation distortion (IM). Nonlinear distortion products include a $2^{nd}$ Order Intermodulation Term (IM2), a $2^{nd}$ Order Harmonic Distortion Term (HD2), a 3rd Order Intermodulation Term (IM3), and a 3rd Order Harmonic Distortion Term (HD3).

There have been attempts to remove or compensate for the distortions by using the in-phase I or quadrature Q baseband signals to directly calculate distortion products that are then removed from the same in-phase or quadrature baseband signals. For example, U.S. Pat. No. 8,848,824 uses a complex system that may only correct for odd-order nonlinearities, such as IM3. It uses non-linear distortion generators driven appreciably into their non-linear regions. The compensating distortion signals are generated from the in-phase or quadrature path independently.

In U.S. Pat. No. 8,050,649, an RF IM2 generator is configured to only correct for mixer IM2 distortion. The '649 patent is not readily applicable to baseband signal paths and cannot be readily used to correct for both mixer baseband distortion and baseband amplifier distortion. The method of the '649 patent uses the RF signal and a nonlinear distortion generator to produce an IM2 signal to sum into the baseband. Because of such summation, distortion generated in the baseband path may not be cancelled.

In U.S. Pat. No. 8,483,646 the common-mode to differential-mode feedback is configured to correct for only IM2. The method of the '646 patent relies on the common-mode IM2 distortion products already present in the mixer output to generate a differential IM2 compensation signal. If the mixer already has low common-mode IM2 distortion products, there may not be enough IM2 input signal to generate the required output differential IM2 compensation signal.

U.S. Pat. No. 7,876,867 represents an approach where DSP methods are used to calculate distortion components (i.e., an analog solution is not used). The method of the '867 patent uses a digital IM2 generator that calculates the squared magnitude of the I and Q signals, and generates an IM3 signal based on this digital IM2. Since the '867 patent uses a digital approach, it does not have the potential precision that is offered by calculating IM2 distortion in the analog domain. The methods of the '824, '649, and '646 patents may not allow for independent control of all of the distortion components, namely IM2, HD2, IM3, HD3. There are many older approaches that involve feed-forward or pre-distortion and make use of delay lines and couplers, which cannot be easily integrated on chip. It is with respect to these considerations and others that the present disclosure has been written.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

FIG. 7 is a block diagram of an example circuit that can provide HD3 compensation signals at 90° that may be used in a distortion compensation circuit, consistent with an exemplary embodiment.

FIG. 8a is a symbolic representation of a current fold block.

FIG. 8b is a schematic diagram of an example current fold block that may be used as the current fold block illustrated in FIGS. 1 to 7.

FIG. 9a is a symbolic representation of a transconductance amplifier.

FIG. 9b is a schematic diagram of an example differential pair of transistors that may be used as the transconductance amplifier of a distortion compensation circuit, consistent with an exemplary embodiment.

FIG. 10a is a symbolic representation of a multiplier.

FIG. 10b is a schematic diagram of an example multiplier that may be used as the multiplier of a distortion compensation circuit, consistent with an exemplary embodiment.

DETAILED DESCRIPTION OF ILLUSTRATIVE EMBODIMENTS

Figure 1:
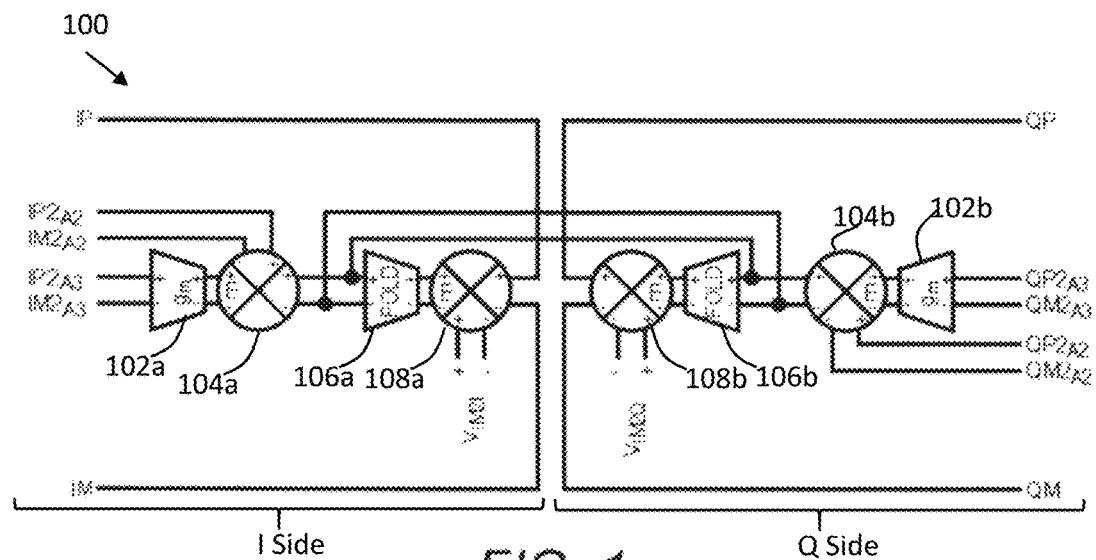
FIG. 1 is a block diagram of an example circuit that can provide IM2 compensation signals that may be used in a distortion compensation circuit, consistent with an exemplary embodiment.

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings. Some embodiments may be practiced with additional components or steps and/or without all of the components or steps that are described.

The various methods and circuits disclosed herein generally relate to circuits and methods for correcting distortion for in-phase and quadrature component signals. In one aspect, a distortion compensation circuit compensates for distortion in a baseband quadrature Q signal and a corresponding baseband in-phase I signal. The distortion compensation circuit includes an in-phase I attenuator that attenuates the baseband in-phase I signal. There is an in-phase Q attenuator that attenuates the baseband quadrature Q signal. There are one or more calculation circuits that are configured to receive the attenuated in-phase I signal and the attenuated baseband Q signal. Based on these signals, the one or more calculation circuits calculate parameters, such as at least one of: IM2, HD2@0°, HD2@90°, IM3@0°, IM3@90°, HD3@0°, and HD3@90°. In one aspect, the distortion compensation circuit is configured to use the result of at least one of the calculation circuits to generate I and Q distortion compensation output signals.

In various embodiments, the distortion compensation circuit may generate the I and Q distortion compensation signals by substantially using the result of a single calculation circuit, a plurality of the calculation circuits, or all of the calculation circuits, depending on the application.

In one aspect, the circuits and methods described herein can correct or compensate for the distortion in IQ communication signal paths with substantially independent control of each distortion component. To that end the circuit may use an analog computation method to directly calculate from the I and Q signals the distortion products independently. Advantageously, in one aspect, the circuits and methods described herein are low-current and lend themselves to monolithic integration.

With the foregoing overview, it may be helpful to provide a mathematical explanation of the concepts discussed herein. In this regard, consider I and Q baseband 2-tone signals provided in equations A1 and A2 below:

$$I = \cos(\omega_1 t) + \cos(\omega_2 t) \quad \text{Eq. A1}$$

$$Q = \sin(\omega_1 t) + \sin(\omega_2 t) \quad \text{Eq. A2}$$

If these base-band signals are passed through a non-linearity comprising up to 3rd order terms, the following can be written:

$$I_{DIST} = \alpha_1 I + \alpha_2 I^2 + \alpha_3 I^3 \quad \text{Eq. B1}$$

Equation B1 can be expanded as provided in equation B2 below:

$$I_{DIST} = (\alpha_1 + 9\alpha_3/4)\cos(\omega_1 t) + (\alpha_1 + 9\alpha_3/4)\cos(\omega_2 t) + \alpha_2 + \alpha_2 \cos(\omega_2 t - \omega_1 t) + \alpha_2 \cos(\omega_2 t + \omega_1 t) + \alpha_2 \cos(2\omega_1 t)/2 + \alpha_2 \cos(2\omega_2 t)/2 + 3\alpha_3 \cos(2\omega_1 t - \omega_2 t)/4 + 3\alpha_3 \cos(2\omega_2 t - \omega_1 t)/4 + 3\alpha_3 \cos(2\omega_2 t + \omega_1 t)/4 + 3\alpha_3 \cos(2\omega_1 t + \omega_2 t)/4 + \alpha_3 \cos(3\omega_1 t)/4 + \alpha_3 \cos(3\omega_2 t)/4 \quad \text{Eq. B2}$$

Linear and nonlinear terms may be identified as follows:

$I_{DIST}$=Linear Terms and DC Offset+$2^{nd}$ Order Intermodulation Term $IM2$+$2^{nd}$ Order Harmonic Distortion Terms $HD2$+$3^{rd}$ Order Intermodulation Terms $IM3$+$3^{rd}$ Order Harmonic Distortion Terms $HD3$ 　Eq. B3

A similar expansion can be performed for the quadrature distortion component $Q_{DIST}$.

Then, each of the following distortion components can be directly calculated as provided in equations 1 to 7 below:

$$IM2 = I^2 + Q^2 = 2\cos(\omega_2 t - \omega_1 t) + 2 \quad \text{Eq. 1}$$

$$HD2@0° = I^2 - Q^2 = 2\cos(\omega_2 t + \omega_1 t) + \cos(2\omega_1 t) + \cos(2\omega_2 t) \quad \text{Eq. 2}$$

$$HD2@90° = 2IQ = 2\sin(\omega_2 t + \omega_1 t) + \sin(2\omega_1 t) + \sin(2\omega_2 t) \quad \text{Eq. 3}$$

$$IM3@0° = I^3 + Q^2 I = \cos(2\omega_2 t - \omega_1 t) + \cos(2\omega_1 t - \omega_2 t) + 3\cos(\omega_2 t) + 3\cos(\omega_1 t) \quad \text{Eq. 4}$$

$$IM3@90° = I^2 Q + Q^3 = \sin(2\omega_2 t - \omega_1 t) + \sin(\omega_1 t - \omega_1 t) + 3\sin(\omega_2 t) + 3\sin(\omega_1 t) \quad \text{Eq. 5}$$

$$HD3@0° = I^3 - 3Q^2 I = 3\cos(2\omega_2 t + \omega_1 t) + 3\cos(2\omega_1 t + \omega_2 t) + \cos(3\omega_2 t) + \cos(3\omega_1 t) \quad \text{Eq. 6}$$

$$HD3@90° = 3I^2 Q - Q^3 = 3\sin(2\omega_2 t + \omega_1 t) + 3\sin(2\omega_1 t + \omega_2 t) + \sin(3\omega_2 t) + \sin(3\omega_1 t) \quad \text{Eq. 7}$$

Each distortion calculation in equations 1 to 7 uses two tone I and Q elements in the analog domain to represent a distortion component. Equations 1 to 7 above have the same form as the nonlinear terms in the expanded $I_{DIST}$ and $Q_{DIST}$ expressions. The advantage of having isolated distortion components in each equation 1 to 7, is that, for a particular application, the distortion levels of the components may be different, and these equations show that the distortion components can be independently controlled. The equations show that the distortion components can be generated directly by algebraic operations on the in-phase and quadrature signals, whereas prior art distortion compensation signals have used non-linear distortion generators implemented with degenerated differential pairs, or DSP methods that inherently suffer from high-current consumption, have limited bandwidth, and other drawbacks.

Each of these equations can be realized at a mixer or amplifier output as combinations of multipliers and current summation or subtraction elements. The input signal level (e.g., voltage or current) can be scaled with an attenuator to provide the appropriate scaling factor for the overall distortion level. The overall distortion level may have some variation for a particular application, such as an integrated circuit, where process parameter variation and device matching may be a contributing factor. The appropriate scaling factor for the attenuator in this case may be chosen to provide a signal large enough to compensate for the worst case distortion level expected. In one embodiment, the output currents from each distortion compensation circuit are scaled for independent control of each distortion component. By scaling the output currents independently, the distortion level variation due to process parameter variation and device matching errors may be better compensated for each device.

Reference now is made to FIGS. 1 to 7, which illustrate example embodiments of circuits that implement the functions of equations 1 to 7, respectively. Each of the FIGS. 1 to 7 includes an "I side" and a "Q side," which may be substantially similar, in some cases. In this regard, aspects of each circuit may be discussed in the context of the "I side" and not repeated for the "Q side," for brevity.

FIG. 1 is a block diagram of an example circuit that can provide IM2 compensation signals that may be used in a distortion compensation circuit. FIG. 1 is a second order intermodulation circuit configured to calculate a second order intermodulation correction signal IM2 based on Eq. 1 above (i.e., $IM2=I^2+Q^2$).

Circuit 100 includes in phase inputs I (i.e., $IP2_{A2}/IM2_{A2}$ and $IP2_{A3}/IM2_{A3}$) and quadrature inputs Q (i.e., $QP2_{A3}/QM2_{A3}$ and $QP2_{A2}/QM2_{A2}$), where the I inputs ($IP2_{A2}/IM2_{A2}$ and $IP2_{A3}/IM2_{A3}$) and Q inputs ($QP2_{A3}/QM2_{A3}$ and $QP2_{A2}/QM2_{A2}$) may be attenuated (e.g., by use of a voltage attenuator) versions of the I and Q inputs, respectively. The I side of circuit 100 includes a transconductance block 102a, a multiplier 104a, a fold circuit 106a, and an output multiplier 108a. The multiplier 104a multiplies the two input I signals, providing at its output the $I^2$ term in equation 1. The multiplier 104b multiplies the two Q signals, providing the $Q^2$ of equation 1.

Figure 12:
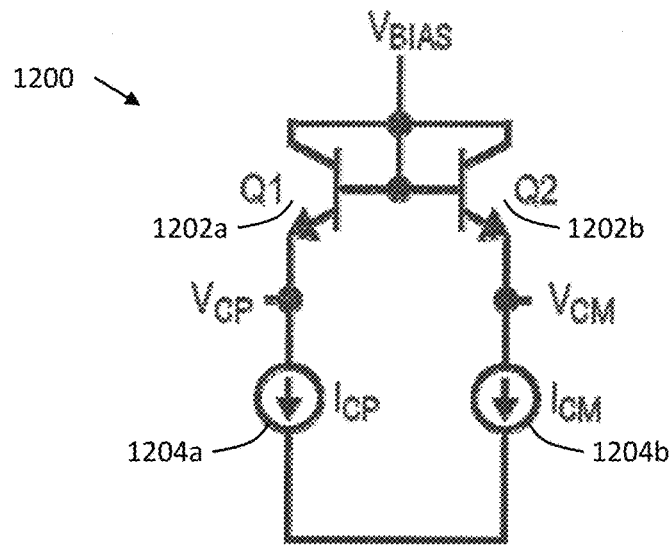
FIG. 12 is a schematic diagram of an example circuit that may be used to transform control currents into control voltages.

The $I^2$ term and the $Q^2$ are summed by the folding circuit 108a for the I side, and the folding circuit 108b for the Q side, thereby providing the second order intermodulation correction signal of equation 1. In one embodiment the output signals of the I side and Q side may be scaled independently by multipliers 108a and 108b, based on inputs $V_{IM2I}$ and $V_{IM2Q}$, respectively. $V_{IM2I}$ and $V_{IM2Q}$ are differential DC control voltages that can be generated by passing a differential control current through diodes as shown in FIG. 12. The $V_{IM2I}$ and $V_{IM2Q}$ components can be adjusted independently to obtain the optimal amount and polarity of IM2 distortion to cancel the IM2 distortion present in the original I or Q signal paths. In one embodiment, the determination of the optimal amount of distortion is performed by a calibration step for the IQ signal path, wherein the IM2 component generated by a 2-tone test signal of the form shown in Eq. A1 and A2 is measured in the analog or digital domain using a measuring receiver capable of frequency selectively measuring the IM2 tone power present at the IM2 distortion frequency. Optimization algorithms could be applied to iteratively measure and reduce the IM2 level by calculating an updated control current value at each iteration.

Figure 2:
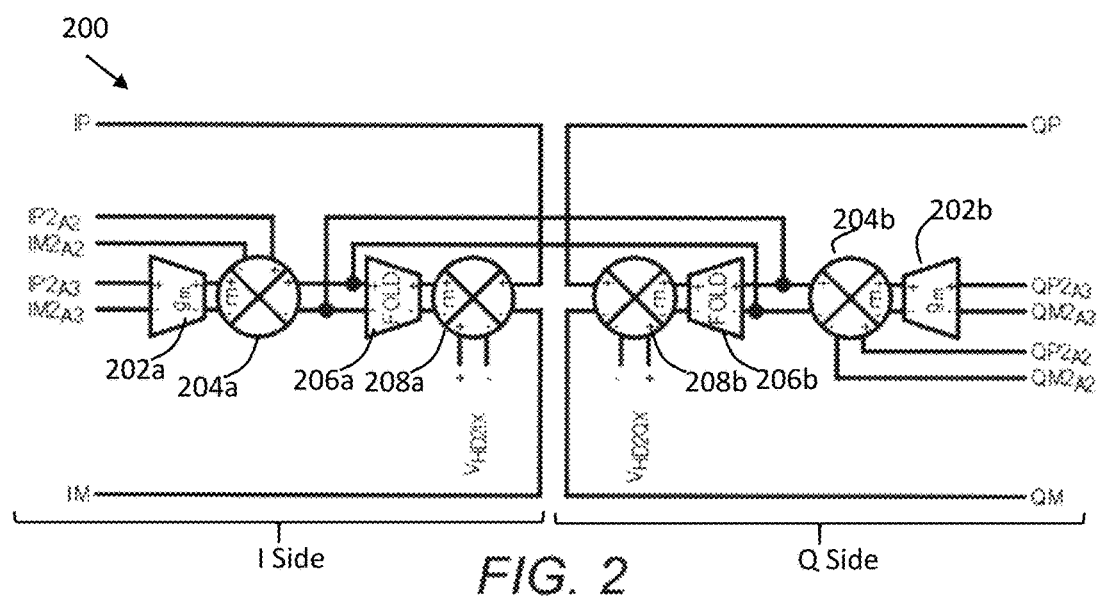
FIG. 2 is a block diagram of an example circuit that can provide HD2 compensation signals at 0° that may be used in a distortion compensation circuit, consistent with an exemplary embodiment.

FIG. 2 is a block diagram of an example circuit that can provide HD2 compensation signals at 0° that may be used in a distortion compensation circuit. Circuit 200 is a second order harmonic distortion circuit configured to calculate a second order harmonic correction signal HD2@0° based on equation 2 above (i.e., $HD2@0°=I^2-Q^2$). The inputs and components of circuit 200 are substantially similar to those of circuit 100, and will therefore not be repeated here for brevity.

The multiplier 204a, multiplies the two input I signals, providing the $I^2$ term of equation 2. The multiplier 204b multiplies the two Q signals, providing the $Q^2$ of equation 2. Since the $I^2$ term and the $Q^2$ are coupled to the inverse polarities of folding circuits 206a and 206b, each folding circuit 108a/108b subtracts the $I^2$ and $Q^2$ signals from each other for the I side and Q side, respectively. In one embodiment the output signals of the I side and Q side may be scaled independently by multipliers 208a and 208b, based on inputs $V_{HD2IX}$ and $V_{HD2QX}$, respectively.

Figure 3:
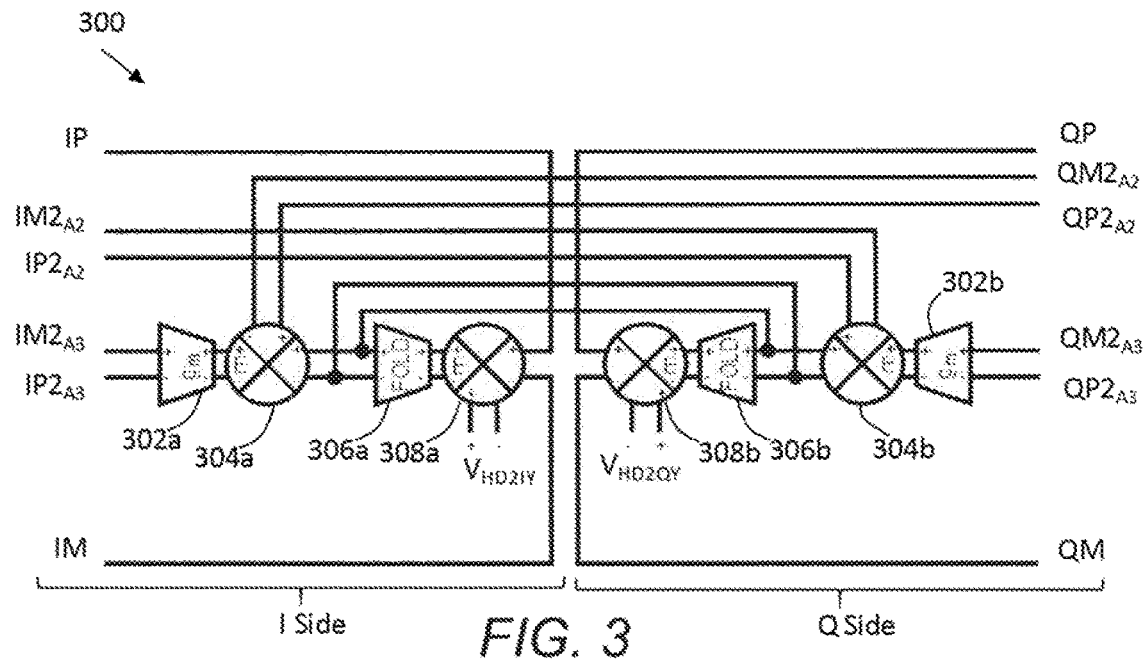
FIG. 3 is a block diagram of an example circuit that can provide HD2 compensation signals at 90° that may be used in a distortion compensation circuit, consistent with an exemplary embodiment.

FIG. 3 is a block diagram of an example circuit that can provide HD2 compensation signals at 90° that may be used in a distortion compensation circuit. Circuit 300 is a second order harmonic distortion circuit configured to calculate a second order harmonic correction signal HD2@90° based on equation 3 above (i.e., $HD2@90°=2IQ$). The inputs and components of circuit 300 are substantially similar to those of circuits 100 and 200, and will therefore not be repeated here for brevity.

The multiplier 304a, multiplies the input I signal by the input Q signal, providing an IQ term. Similarly multiplier 304b multiplies the input Q signal with the input I signal, providing another IQ term. Both IQ terms are summed by the folding circuits 306a and 306b, respectively, thereby providing the 2IQ term of equation 3. In one embodiment the output signals of the I side and Q side may be scaled independently by multipliers 308a and 308b, based on inputs $V_{HD2IY}$ and $V_{HD2QY}$, respectively.

Figure 4:
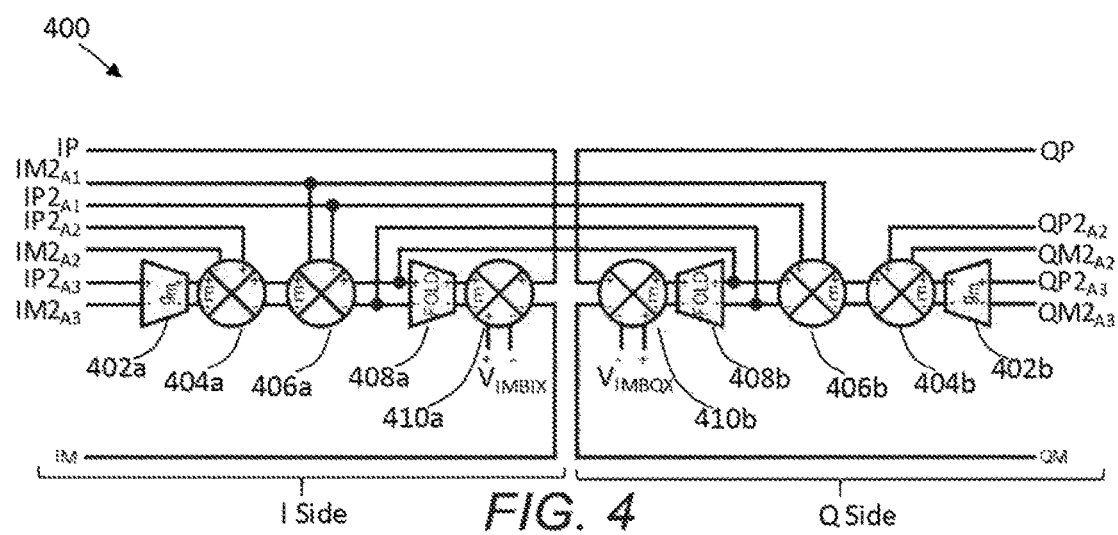
FIG. 4 is a block diagram of an example circuit that can provide IM3 compensation signals at 0° that may be used in a distortion compensation circuit, consistent with an exemplary embodiment.

FIG. 4 is a block diagram of an example circuit that can provide IM3 compensation signals at 0° that may be used in a distortion compensation circuit. Circuit 400 is a third order intermodulation circuit configured to calculate a third order intermodulation correction signal IM3@0° based on equation 4 above, (i.e., $IM3@0°=I^3+Q^2I$). Since the equation 4 is more involved, it will be understood that circuit 400 is a bit more complicated.

Circuit 400 includes in phase inputs I (i.e., $IP2_{A2}/IM2_{A2}$, $IP2_{A3}/IM2_{A3}$, and $IP2_{A1}/IM2_{A1}$) and quadrature inputs Q (i.e., $QP2_{A3}/QM2_{A3}$ and $QP2_{A2}/QM2_{A2}$). The I side of circuit 400 includes a transconductance block 402a, a first multiplier 404a, a second multiplier 406a, a fold circuit 408a, and an output multiplier 410a. The first multiplier 404a provides an $I^2$ output, which is multiplied by another I by the second multiplier 406a, thereby providing the $I^3$ component of equation 4.

On the Q side, the output of the first multiplier 404b provides the $Q^2$ component. The second multiplier on the Q side 406b multiplies the $Q^2$ component by I, thereby providing the $Q^2I$ component of equation 4. The $I^3$ and the $Q^2I$ components are summed together by the folding circuits 408a and 408b, respectively, thereby providing the third order intermodulation correction signal of equation 4. In one embodiment the output signals of the I side and Q side may be scaled independently by multipliers 410a and 410b, based on inputs $V_{IM3IX}$ and $V_{IM3QX}$, respectively.

Figure 5:
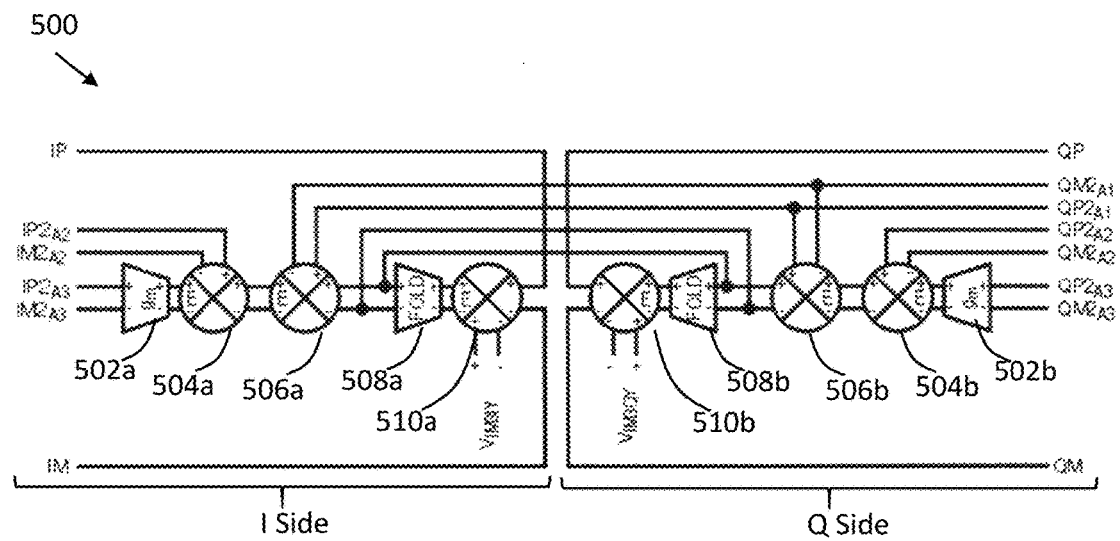
FIG. 5 is a block diagram of an example circuit that can provide IM3 compensation signals at 90° that may be used in a distortion compensation circuit, consistent with an exemplary embodiment.

FIG. 5 is a block diagram of an example circuit that can provide IM3 compensation signals at 90° that may be used in a distortion compensation circuit. Circuit 500 is a third order intermodulation circuit configured to calculate a third order intermodulation correction signal IM3@90° based on equation 5 above (i.e., $IM3@90°=I^2Q+Q^3$). Circuit 500 includes in phase inputs I (i.e., $IP2_{A2}/IM2_{A2}$, and $IP2_{A3}/IM2_{A3}$) and quadrature inputs Q (i.e., $QP2_{A3}/QM2_{A3}$, $QP2_{A2}/QM2_{A2}$, and $QP2_{A1}/QM2_{A1}$. The components of the circuit 500 are substantially similar to those of circuit 400, and will therefore not be repeated here for brevity.

On the Q side, the first multiplier 504b provides a $Q^2$ output, which is multiplied by another Q by the second multiplier 506b, thereby providing the $Q^3$ component of equation 5.

On the I side, the output of the first multiplier 504a provides the $I^2$ component. The second multiplier on the I side 506a multiplies the $I^2$ component by Q, thereby providing the $I^2Q$ component of equation 5. The $Q^3$ and the $I^2Q$ components are summed together by the folding circuits 508a and 508b, respectively, thereby providing the third order intermodulation correction signal of equation 5. In one embodiment the output signals of the I side and Q side may be scaled independently by multipliers 510a and 510b, based on inputs $V_{IM3IY}$ and $V_{IM3QY}$, respectively.

Figure 6:
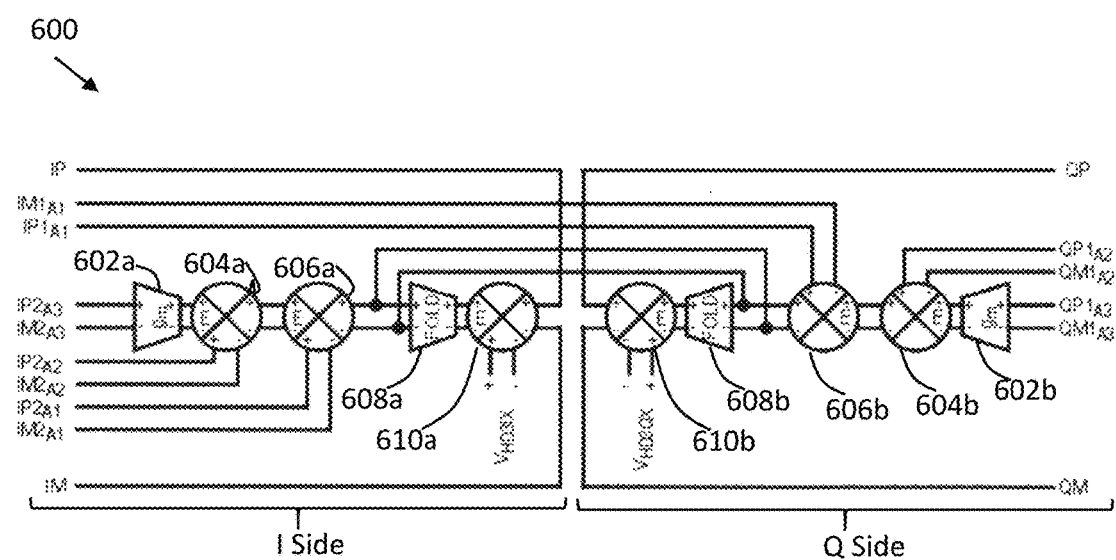
FIG. 6 is a block diagram of an example circuit that can provide HD3 compensation signals at 0° that may be used in a distortion compensation circuit, consistent with an exemplary embodiment.

FIG. 6 is a block diagram of an example circuit that can provide HD3 compensation signals at 0° that may be used in a distortion compensation circuit. Circuit 600 is a third order harmonic distortion circuit configured to calculate a third order harmonic correction signal HD3@0° based on equation 6 above (i.e., HD3@0°=$I^3$−$3Q^2I$).

Circuit 600 includes in phase inputs I (i.e., $IP2_{A2}/IM2_{A2}$, $IP2_{A3}/IM2_{A3}$, $IP2_{A1}/IM2_{A1}$, and $IP1_{A1}/IM1_{A1}$) and quadrature inputs Q (i.e., $QP1_{A3}/QM1_{A3}$ and $QP1_{A2}/QM1_{A2}$). The components of the circuit 600 are substantially similar to those of circuits 400 and 500, and will therefore not be repeated here for brevity.

On the I side, the first multiplier 604a provides an $I^2$ output, which is multiplied by another I by the second multiplier 606a, thereby providing the $I^3$ component of equation 6.

On the Q side, the signals are provided by a Q-side attenuator that provides signals that are greater than the I-side signals by a factor of $3^{(1/3)}$. Accordingly, the first multiplier 604b on the Q side calculates $3^{(1/3)}Q*3^{(1/3)}Q=3^{(2/3)}Q^2$. The second multiplier 606b on the Q side calculates $3^{(1/3)}I*3^{(2/3)}Q^2=3IQ^2$, thereby providing the remaining component of equation 6. Since the $I^3$ term and the $3IQ^2$ are coupled to the inverse polarities of folding circuits 608a and 608b, each folding circuit 608a/608b subtracts the $I^3$ and $3IQ^2$ signals from each other for the I side and Q side, respectively.

In one embodiment the output signals of the I side and Q side may be scaled independently by multipliers 610a and 610b, based on inputs $V_{HD3IX}$ and $V_{HD3QX}$, respectively. It is noted that the attenuator connections such as M1 or P1 are $3^{(1/3)}$ larger in magnitude than the M2 or P2 signals, so that a signal like IM1A1 is $3^{(1/3)}$ times greater than IM2A1.

FIG. 7 is a block diagram of an example circuit that can provide HD3 compensation signals at 90° that may be used in a distortion compensation circuit. Circuit 700 is a third order harmonic distortion circuit configured to calculate a third order harmonic correction signal HD3@90° based on equation 7 above (i.e., HD3@90°=$3I^2Q$−$Q^3$).

Circuit 700 includes in phase inputs I (i.e., $IP1_{A2}/IM1_{A2}$, and $IP1_{A3}/IM1_{A3}$) and quadrature inputs Q (i.e., $QP2_{A3}/QM2_{A3}$, $QP2_{A2}/QM2_{A2}$, $QP2_{A1}/QM2_{A1}$, and $QP1_{A1}/QM1_{A1}$). The components of the circuit 700 are substantially similar to those of circuit 600, and will therefore not be repeated here for brevity.

On the Q side, the first multiplier 704b provides a $Q^2$ output, which is multiplied by another I by the second multiplier 706b, thereby providing the $Q^3$ component of equation 7. In one embodiment, the quadrature Q attenuator attenuates the baseband quadrature Q signal such that it is greater than the attenuated baseband quadrature Q signal by a factor of $3^{(1/3)}$.

On the I side, the signals are provided by an I-side attenuator that provides signals that are greater than the Q-side signals by a factor of $3^{(1/3)}$. So the first multiplier 704a on the Q side calculates $3^{(1/3)}I*3^{(1/3)}I=3^{(2/3)}I^2$. The second multiplier 706a on the I side calculates $3^{(1/3)}Q*3^{(2/3)}I^2=3QI^2$, thereby providing the remaining component of equation 7. Since the $Q^3$ term and the $3QI^2$ are coupled to the inverse polarities of folding circuits 708a and 708b, each folding circuit 708a/708b subtracts the $I^3$ and $3QI^2$ signals from each other for the I side and Q side, respectively.

In one embodiment the output signals of the I side and Q side may be scaled independently by multipliers 710a and 710b, based on inputs $V_{HD3IY}$ and $V_{HD3QY}$, respectively. In essence, circuit 700 is substantially similar to circuit 600, except that the circuit has been flipped between the I side and Q side.

Accordingly, it has been shown that FIGS. 1 to 7 show block level schematics of an example implementation of each of the equations 1-7, respectively. In each of the figures, the blocks named "$g_m$" may each be transconductance amplifiers, such as the one discussed later in the context of in FIG. 9b. The blocks marked with an X may each be multipliers, such as the one discussed in more detail later in the context of FIG. 10b. The blocks named "FOLD" may each be current folds, such as the one discussed in more detail in the context of FIG. 8b.

FIG. 8a is a symbol of a current fold block and FIG. 8b is an example schematic diagram of the symbol of FIG. 8a. Circuit 800 illustrates, by way of example, a circuit that may be used as the current fold block illustrated in FIGS. 1 to 7. Circuit 800 includes a left side and a right side, which are mutually similar. The two halves can be viewed as single-ended circuits that have been mated together to form a differential configuration. Accordingly, resistor R1 (804a), transistor Q1 (806a), and current source I1 (808a) may be matched by R2 (804b), Q2 (806b), and I2 (808b), respectively. A differential current impressed on nodes $I_{INP}$ and $I_{INM}$ may be folded and output through nodes $I_{OUTP}$ and $I_{OUTM}$. For example, the current provided at output node $I_{OUTP}$ is substantially similar to the current at the emitter of transistor Q1 (806a). The same is true on the right side of the circuit 800.

Voltage bias point $V_{BFOLD}$ may be set so that the common mode voltage of the input nodes (i.e., $I_{INP}$ and $I_{INM}$) does not cause the preceding transistors (i.e., Q1 and Q2, respectively) to saturate. For example, resistors R1/R2 may be configured to provide about a 500 mV drop from the positive rail 810 (which may be Vcc for bipolar, Vdd for FET, or any other suitable voltage). Accordingly, the voltage at the common node $V_{BFOLD}$ may be about 1.2V below the positive rail 810, due to the diode voltage drop from transistors Q1 and Q2, respectively.

FIG. 9a is a symbol of a transconductance amplifier and FIG. 9b is a schematic diagram of an example differential pair of transistors that may be used as the transconductance amplifier illustrated in FIGS. 1 to 7. In the example of circuit 900, two transistors 904a and 904b share a common node at each emitter, respectively, which is coupled to a current source 906. In one embodiment, the transconductance $g_m$ may be equal to $I1/(2V_T)$, where $V_T$ is the transistor thermal voltage.

FIG. 10a is a symbol of a multiplier and FIG. 10b is a schematic diagram of an example multiplier that may be used as the multiplier illustrated in FIGS. 1 to 7. Circuit 1000 includes a first pair of transistors 1004 and 1006 sharing a common node at their collector. There is a second pair of transistors 1008 and 1010 sharing a common node at their emitter. The collector of transistor 1004 is coupled to the collector of transistor 1010, providing the $I_{OUTP}$ node. The collector of transistor 1006 is coupled to the collector of transistor 1008, providing the $I_{OUTM}$ node. A differential voltage at $V_{INP}$, $V_{INM}$ may commutate a differential current at $I_{INP}$, $I_{INM}$ to the outputs $I_{OUTP}$, $I_{OUTM}$. In one embodiment, the output current may be provided by equation 8:

$$I_{OUTP} - I_{OUTM} = (I_{INP} - I_{INM}) \tan h[(V_{INP} - V_{INM})/(2V_T)] \quad \text{Eq. 8}$$

Figure 11:
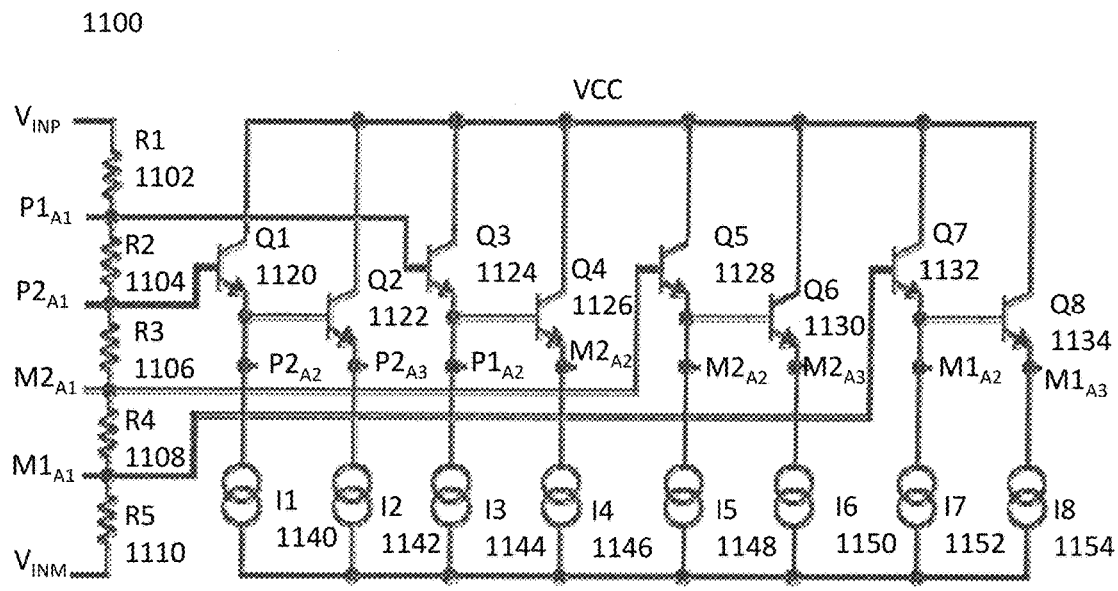
FIG. 11 is a schematic diagram of an example input attenuator and voltage buffers that may be used as each of the input attenuators and voltage buffers illustrated in FIG. 13.

FIG. 11 is a schematic diagram of an example input attenuator and voltage buffer circuit, which is sometimes referred to herein as an "attenuator." Circuit 1100 may be used, for example, to attenuate the baseband in-phase I signal of a distortion compensation circuit. It may also be used to attenuate the baseband quadrature signal. An example application will be illustrated later in the context of FIG. 13.

Circuit 1100 includes resistors R1 (1102), R2 (1104), R3 (1106), R4 (1108), and R5 (1110) connected in series. Circuit 1100 also includes transistors Q1 (1120), Q2 (1122), Q3 (1124), Q4 (1126), Q5 (1128), Q6 (1130), Q7 (1132), and Q8 (1134), which are each configured as emitter followers, having each emitter coupled to a corresponding current source (i.e., I1 (1140) to I8 (1154), respectively).

In one embodiment, the resistance pairs R1/R5 and R2/R4 match. The values of the resistances may be adjusted such that the voltage signal at the P1, M1 nodes is $\sqrt[3]{3}$ times larger than the voltage signal at the P2, M2 nodes. The attenuator factor $\sqrt[3]{3}$ may be chosen in order to implement the factor 3 in equations 6 and 7, since three signals are being multiplied together. In one embodiment, resistances R2 and R4 are set to be 0.2211 times the value of R3 to obtain this $\sqrt[3]{3}$ factor.

Resistances R1 and R5 may be set to control the amount of signal attenuation for a desired range of distortion to be generated by the distortion compensation sub-blocks. Matched transistors Q1 to Q8 along with their associated current sources may be voltage buffers used for level shifting of the voltage signals from the attenuator to suitable bias points for the operation of the compensation circuits.

FIG. 12 is a schematic diagram of an example circuit that may be used to transform control currents into control voltages. Circuit 1200 includes a left half and a right half that are mutually similar. The two halves can be viewed as single-ended circuits that have been mated together to form a differential configuration of current to voltage circuit.

Each half includes a diode connected transistor (1202a and 1202b, respectively) that is coupled to a current source (1204a and 1204b, respectively). Accordingly, circuit 1200 is a diode pre-distortion circuit that can be used to transform control currents to control voltages at each of the output multipliers of the compensation circuits. If $I_{CP} = I_0 + I_{CD}/2$, and $I_{CM} = I_0 - I_{CD}/2$ are substituted, where $I_0 = (I_{CP} + I_{CM})/2$, the control voltage outputs can be written in terms of the control current inputs as provided in equation 9 below:

$$V_{CP} - V_{CM} = 2V_T \arctan h[I_{CD}/(2I_0)] \quad \text{Eq. 9}$$

When circuit 1200 is used with the multiplier of FIG. 10, equation 8 may be modified to become:

$$I_{OUTP} - I_{OUTM} = (I_{INP} - I_{INM})I_{CD}/(2I_0) \quad \text{Eq. 10}$$

Figure 13:
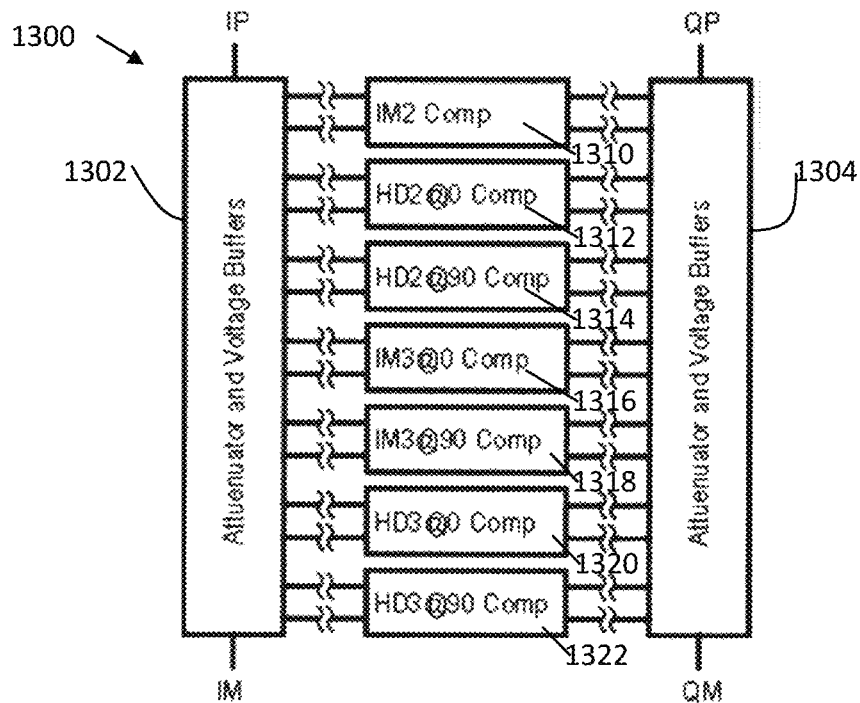
FIG. 13 is a block diagram of an example distortion compensation circuit.

FIG. 13 is a block diagram of an example distortion compensation circuit. Distortion compensation circuit 1300 includes an in-phase I attenuator 1302 that is configured to attenuate the baseband in-phase I signal. There is an in-phase Q attenuator 1304 configured to attenuate the baseband Q signal. In the example of the distortion compensation circuit 1300, the I signal comprises differential signals IP and IM and the Q signal comprises differential signals QP and QM. The attenuators were described by way of example in the context of the discussion of FIG. 11.

In various embodiments, circuit 1300 may include one or more of the circuits that are represented by blocks 1310 to 1322, which are configured to receive the attenuated in-phase I signal and the attenuated baseband Q signal. Each of the circuits 1310 to 1322 is configured to implement the functions of equations 1 to 7 above, respectively.

For example, circuit 1310 is a second order intermodulation circuit configured to calculate a second order intermodulation correction signal IM2 based on $IM2 = I^2 + Q^2$.

Circuit 1312 is a second order harmonic distortion circuit configured to calculate a second order harmonic correction signal HD2@0° based on $HD2@0° = I^2 - Q^2$.

Circuit 1314 is a second order harmonic distortion circuit configured to calculate a second order harmonic correction signal HD2@90° based on $HD2@90° = 2IQ$.

Circuit 1316 is a third order intermodulation circuit configured to calculate a third order intermodulation correction signal IM3@0° based on $IM3@0° = I^3 + Q^2I$.

Circuit 1318 is a third order intermodulation circuit configured to calculate a third order intermodulation correction signal IM3@90° based on $IM3@90° = I^2Q + Q^3$.

Circuit 1320 is a third order harmonic distortion circuit configured to calculate a third order harmonic correction signal HD3@0° based on $HD3@0° = I^3 - 3Q^2I$.

Circuit 1322 is a third order harmonic distortion circuit configured to calculate a third order harmonic correction signal HD3@90° based on $HD3@90° = 3I^2Q - Q^3$.

The distortion compensation circuit 1300 is configured to use the result of at least one of the calculation circuits 1310 to 1322 to generate an I distortion compensation signal (represented by differential signals IP/IM) at a first output, and a Q distortion compensation signal (represented by differential signals QP/QM) at a second output.

Figure 14:
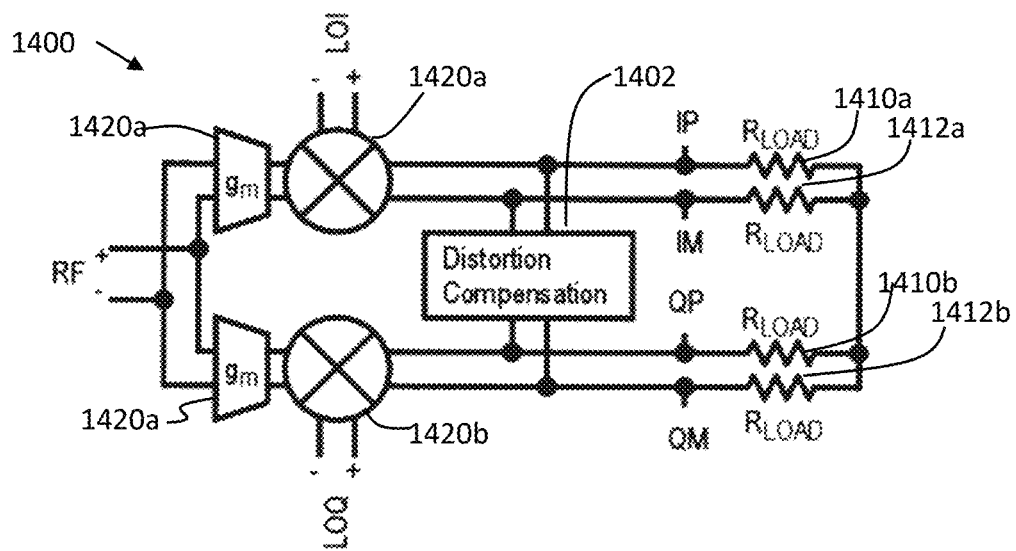
FIG. 14 is a block diagram illustrating use of a distortion compensation circuit to linearize a demodulation circuit.
Figure 15:
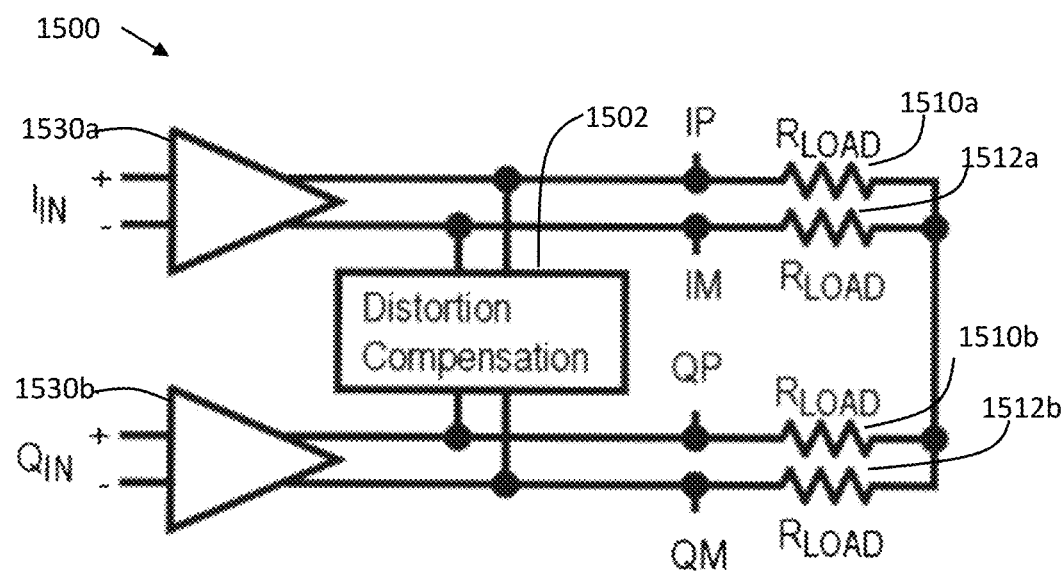
FIG. 15 is a block diagram illustrating use of a distortion compensation circuit to linearize an amplifier.

With the foregoing explanation of the distortion compensation circuit 1300, it may be useful to provide some of the many practical implementations of the distortion compensation circuits and techniques discussed herein. To that end, FIG. 14 is a block diagram illustrating use of a distortion compensation circuit 1402 to linearize a demodulation circuit 1400. In one embodiment, the distortion compensation block 1402 is the circuit illustrated in FIG. 13. Each $R_{LOAD}$ (i.e., 1410a/b and 1412a/b) may be a load resistor. Each circled "X" may be a multiplier circuit (e.g., 1420a and 1420b), such as the one illustrated in FIG. 10b. Each transconductance unit (e.g., 1430a and 1430b) may be a transconductance circuit similar to that of FIG. 9b FIG. 15 is a block diagram illustrating use of a distortion compensation circuit 1502 to linearize an amplifier 1500. In one embodiment, the distortion compensation block 1502 is the circuit illustrated in FIG. 13. The amplifier 1500 comprises amplifiers 1530a and 1530b that may each be differential linear amplifiers. Each $R_{LOAD}$ (i.e., 1510a/b and 1512a/b) may be a load resistor.

Figure 16:
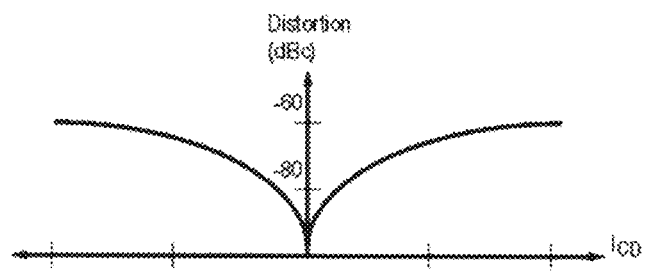
FIG. 16 is a graph of typical distortion versus a differential control current $I_{CD}$.

FIG. 16 is a graph of typical distortion vs a differential control current Icy. The control current Icy may be better understood in view of FIG. 12, where Icy represents the differential current between $V_{CP}$ and $V_{CM}$. By way of example, FIG. 16 illustrates a typical response of one of the distortion components (e.g., IM2, HD2, IM3, and HD3), versus a corresponding differential control current lap as in FIG. 12. Accordingly, FIG. 16 illustrates that, at a calculated ICD, there is a spot where the distortion is reduced most effectively.

The components, steps, features, objects, benefits, and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits, and/or advantages. These also include embodiments in which the components and/or steps are arranged and/or ordered differently.

For example, any signal discussed herein may be scaled, buffered, scaled and buffered, converted to another mode (e.g., voltage, current, charge, time, etc.), or converted to another state (e.g., from HIGH to LOW and LOW to HIGH) without materially changing the underlying control method. Further, higher order distortion products could be compensated for by using this same method. The use of more multipliers and/or different attenuation factors could be used to calculate the result of more complicated equations for higher order distortions such as IM5 HD4 HD5, etc.

In one example, the NPN transistors in FIGS. 9 to 12, could be replaced by NMOS transistors, and the PNP transistors of FIG. 8 could be replaced with PMOS transistors. In other embodiments, the circuits could be reconfigured to use PNP transistors instead of NPN transistors (and PMOS transistors instead of NMOS) while still adhering to the principles of the subject matter disclosed herein.

Still further, the circuits shown in FIGS. 8 to 10 could have their basic function implemented or improved in numerous ways. For example, the transconductor of FIG. 9 could be made more linear by using an emitter degeneration resistance. This may be desirable if the input signals were larger because less attenuation was chosen. A pre-distortion circuit such as that illustrated by FIG. 12 could be used at the multiplier inputs from the attenuator in order to obtain a more linear response for larger input signals.

Even though the "loads" discussed herein are illustrated as resistors, other types of devices that include a resistance, including bipolar and MOS devices, are contemplated as well. Also, the circuits herein can be reconfigured to use current sinks instead of current sources. Accordingly, it is intended that the invention be limited only in terms of the appended claims.

Unless otherwise stated, all measurements, values, ratings, positions, magnitudes, sizes, and other specifications that are set forth in this specification, are approximate, not exact. They are intended to have a reasonable range that is consistent with the functions to which they relate and with what is customary in the art to which they pertain.

Except as stated immediately above, nothing that has been stated or illustrated is intended or should be interpreted to cause a dedication of any component, step, feature, object, benefit, advantage, or equivalent to the public, regardless of whether it is or is not recited in the claims.

All articles, patents, patent applications, and other publications that have been cited in this disclosure are incorporated herein by reference.

It will be understood that the terms and expressions used herein have the ordinary meaning as is accorded to such terms and expressions with respect to their corresponding respective areas of inquiry and study except where specific meanings have otherwise been set forth herein. Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element preceded by an "a" or an "an" does not, without further constraints, preclude the existence of additional elements of the identical type.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. An analog distortion compensation circuit configured to compensate for a distortion in a baseband in-phase (I) signal and a distortion in a corresponding baseband quadrature (Q) signal, the analog distortion compensation circuit comprising:
    an in-phase I attenuator configured to attenuate the baseband in-phase I signal;
    a quadrature Q attenuator configured to attenuate the baseband Q signal; and
    a plurality of the following calculation circuits configured to receive the attenuated in-phase I signal and the attenuated baseband Q signal and perform calculations based on the received attenuated I and Q signals:
    a second order intermodulation circuit configured to calculate a second order intermodulation correction signal IM2 based on $IM2=I^2+Q^2$;
    (ii) a second order harmonic distortion circuit configured to calculate a second order harmonic correction signal HD2@0° based on $HD2@0°=I^2-Q^2$;
    (iii) a second order harmonic distortion circuit configured to calculate a second order harmonic correction signal HD2@90° based on $HD2@90°=2IQ$;
    (iv) a third order intermodulation circuit configured to calculate a third order intermodulation correction signal IM3@0° based on $IM3@0°=I^3+Q^2I$;
    (v) a third order intermodulation circuit configured to calculate a third order intermodulation correction signal IM3@90° based on $IM3@90°=I^2Q+Q^3$;
    (vi) a third order harmonic distortion circuit configured to calculate a third order harmonic correction signal HD3@0° based on $HD3@0°=I^3-3Q^2I$; and
    (vii) a third order harmonic distortion circuit configured to calculate a third order harmonic correction signal HD3@90° based on $HD3@90°=3I^2Q-Q^3$,
    wherein the analog distortion compensation circuit is configured to use a result of the plurality of the calculation circuits to generate an I distortion compensation signal at a first output and a Q distortion compensation signal at a second output.

2. The analog distortion compensation circuit of claim 1, wherein the distortion compensation circuit is configured to substantially use a result of all of the calculation circuits to generate the I distortion compensation signal at the first output and the Q distortion compensation signal at the second output.

3. The analog distortion compensation circuit of claim 1, further comprising a scaling circuit coupled to an output of each of the at least one calculation circuits, wherein the correction signal of each of the at least one calculation circuits is scaled independently by the scaling circuit.

4. The analog distortion compensation circuit of claim 1, wherein the distortion compensation circuit is configured to process differential I and Q signals.

5. The analog distortion compensation circuit of claim 1, wherein the second order intermodulation circuit configured to calculate the second order intermodulation correction signal IM2 comprises:
an I side comprising:
  a first transconductance circuit coupled to an input of a first multiplier; and
  a first fold circuit coupled between an output of the first multiplier and an input of a second multiplier,
  wherein an $I^2$ component of the IM2 signal is provided at the output of the first multiplier; and
a Q side comprising:
  a third transconductance circuit coupled to a third multiplier; and
  a second fold circuit coupled between the third multiplier and a fourth multiplier;
  wherein a $Q^2$ component of the IM2 signal is provided at the output of the third multiplier,
wherein the first fold circuit is configured to add the $I^2$ component at the output of the first multiplier with the $Q^2$ component at the output of the third multiplier to provide an $I^2+Q^2$ component of the IM2 signal for the I side, and
wherein the second fold circuit is configured to add the $I^2$ component at the output of the first multiplier with the $Q^2$ component at the output of the third multiplier to provide an $I^2+Q^2$ component of the IM2 signal for the Q side.

6. The analog distortion compensation circuit of claim 1, wherein the second order harmonic distortion circuit configured to calculate a second order harmonic correction signal HD2@0° comprises:
an I side comprising:
  a first transconductance circuit coupled to an input of a first multiplier; and
  a first fold circuit coupled between an output of the first multiplier and an input of a second multiplier,
  wherein an $I^2$ component of the HD2@0° signal is provided at the output of the first multiplier; and
a Q side comprising:
  a second transconductance circuit coupled to a third multiplier; and
  a second fold circuit coupled between the third multiplier and a fourth multiplier,
  wherein a $Q^2$ component of the HD2@0° signal is provided at an output of the third multiplier,
wherein the first fold circuit is configured to subtract from the $I^2$ component at the output of the first multiplier, the $Q^2$ component at the output of the third multiplier, to provide an $I^2-Q^2$ component of the HD2@0° signal for the I side, and
wherein the second fold circuit is configured to subtract from the $I^2$ component at the output of the first multi-plier, the $Q^2$ component at the output of the third multiplier, to provide an $I^2-Q^2$ component of the HD2@0° signal for the Q side.

7. The analog distortion compensation circuit of claim 1, wherein the second order harmonic distortion circuit configured to calculate the second order harmonic correction signal HD2@90° comprises:
an I side comprising:
  a first transconductance circuit coupled to an input of a first multiplier; and
  a first fold circuit coupled between an output of the first multiplier and an input of a second multiplier,
  wherein a first IQ component of the HD2@90° signal is provided at the output of the first multiplier; and
a Q side comprising:
  a second transconductance circuit coupled to an input of a third multiplier; and
  a second fold circuit coupled between an output of the third multiplier and an input of a fourth multiplier,
  wherein a second IQ component of the HD2@90° signal is provided at the output of the third multiplier; and
wherein the first fold circuit is configured to add the first IQ component at the output of the first multiplier with the second IQ component at the output of the third multiplier to provide an 2IQ component of HD2@90° signal for the I side, and
wherein the second fold circuit is configured to add the first IQ component at the output of the first multiplier with the second IQ component at the output of the third multiplier to provide an 2IQ component of the HD2@90° signal at the Q side.

8. The analog distortion compensation circuit of claim 1, wherein the third order intermodulation circuit configured to calculate the third order intermodulation correction signal IM3@0° comprises:
an I side comprising:
  a first transconductance circuit coupled to an input of a first multiplier;
  a second multiplier coupled to an output of the first multiplier;
  a first fold circuit coupled between an output of the second multiplier and an input of a third multiplier,
  wherein an $I^3$ component of the IM3@0° signal is provided at the output of the second multiplier; and
a Q side comprising:
  a second transconductance circuit coupled to a fourth multiplier;
  a fifth multiplier coupled to an output of the fourth multiplier;
  a second fold circuit coupled between an output of the fifth multiplier and an input of the sixth multiplier,
  wherein a $Q^2I$ component of the IM3@0° signal is provided at the output of the fifth multiplier; and
wherein the first fold circuit is configured to add the $I^3$ component at the output of the second multiplier with the $Q^2I$ component at the output of the fifth multiplier to provide an $I^3+Q^2I$ component of the IM3@0° signal for the I side, and
wherein the second fold circuit is configured to add the $I^3$ component at the output of the second multiplier with the $Q^2I$ component at the output of the fifth multiplier to provide an $I^3+Q^2I$ component of the IM3@0° signal for the Q side.

9. The analog distortion compensation circuit of claim 1, wherein the third order intermodulation circuit configured to calculate a third order intermodulation correction signal IM3@90° comprises:
an I side comprising:
a first transconductance circuit coupled to an input of a first multiplier;
a second multiplier coupled to an output of the first multiplier;
a first fold circuit coupled between an output of the second multiplier and an input of a third multiplier, wherein an $I^2Q$ component of the IM3@90° signal is provided at the output of the second multiplier; and
a Q side comprising:
a second transconductance circuit coupled to a fourth multiplier;
a fifth multiplier coupled to an output of the fourth multiplier;
a second fold circuit coupled between an output of the fifth multiplier and an input of the sixth multiplier, wherein a $Q^3$ component of the IM3@90° signal is provided at the output of the fifth multiplier; and
wherein the first fold circuit is configured to add the $I^2Q$ component at the output of the second multiplier with the $Q^3$ component at the output of the fifth multiplier to provide an $I^2Q+Q^3$ component of the IM3@90° signal for the I side, and
wherein the second fold circuit is configured to add the $Q^3$ component at the output of the second multiplier with the $I^2Q$ component at the output of the fifth multiplier to provide an $I^2Q+Q^3$ component of the IM3@90° signal for the Q side.

10. The analog distortion compensation circuit of claim 1, wherein the third order harmonic distortion circuit configured to calculate a third order harmonic correction signal HD3@0° comprises:
an I side comprising:
a first transconductance circuit coupled to an input of a first multiplier;
a second multiplier coupled to an output of the first multiplier;
a first fold circuit coupled between an output of the second multiplier and an input of a third multiplier, wherein an $I^3$ component of the HD3@0° signal is provided at the output of the second multiplier; and
a Q side comprising:
a second transconductance circuit coupled to an input of a fourth multiplier;
a fifth multiplier coupled to an output of the fourth multiplier;
a second fold circuit coupled between an output of the fifth multiplier and an input of the sixth multiplier, wherein a $3Q^2I$ component of the HD3@0° signal is provided at the output of the fifth multiplier, and
wherein the first fold circuit is configured to subtract from the $I^3$ component at the output of the second multiplier the $3Q^2I$ component at the output of the fifth multiplier to provide an $I^3-3Q^2I$ component of the HD3@0° signal for the I side, and
wherein the second fold circuit is configured to subtract from the $I^3$ component at the output of the second multiplier the $3Q^2I$ component at the output of the fifth multiplier to provide an $I^3-3Q^2I$ component of the HD3@0° signal for the Q side.

11. The analog distortion compensation circuit of claim 10, wherein the fourth multiplier is configured to provide a $3\hat{Q}(2/3)Q^2$ component at its output that is used by the fourth multiplier to provide the $3Q^2I$ component of the HD3@0° signal for the Q side.

12. The analog distortion compensation circuit of claim 10, wherein the in-phase I attenuator attenuates the baseband in-phase I signal such that it is greater than the attenuated baseband in-phase I signal by a factor of $3^{(1/3)}$.

13. The analog distortion compensation circuit of claim 10, wherein the quadrature Q attenuator attenuates the baseband quadrature Q signal such that it is greater than the attenuated baseband in-phase I signal by a factor of $3^{(1/3)}$.

14. The analog distortion compensation circuit of claim 1, wherein the third order harmonic distortion circuit configured to calculate a third order harmonic correction signal HD3@90° comprises:
an I side comprising:
a first transconductance circuit coupled to an input of a first multiplier;
a second multiplier coupled to an output of the first multiplier;
a first fold circuit coupled between an output of the second multiplier and an input of a third multiplier, wherein an $3I^2Q$ component of the HD3@90° signal is provided at the output of the second multiplier; and
a Q side comprising:
a second transconductance circuit coupled to an input of a fourth multiplier;
a fifth multiplier coupled to the output of the fourth multiplier;
a second fold circuit coupled between an output of the fifth multiplier and an input of the sixth multiplier, wherein a $Q^3$ component of the HD3@90° signal is provided at the output of the fifth multiplier, and
wherein the first fold circuit is configured to subtract from the $3I^2Q$ component at the output of the second multiplier, the $Q^3$ component at the output of the fifth multiplier, to provide an $3I^2Q-Q^3$ component of the HD3@90° signal for the I side, and
wherein the second fold circuit is configured to subtract from the $3I^2Q$ component at the output of the second multiplier, the $Q^3$ component at the output of the fifth multiplier, to provide an $3I^2Q-Q^3$ component of the HD3@90° signal for the Q side.

15. The analog distortion compensation circuit of claim 14, wherein the in-phase I attenuator attenuates the baseband in-phase I signal such that it is greater than the attenuated baseband quadrature Q signal by a factor of $3^{(1/3)}$.

16. The analog distortion compensation circuit of claim 14, wherein the quadrature Q attenuator attenuates the baseband quadrature Q signal such that it is greater than the attenuated baseband quadrature Q signal by a factor of $3^{(1/3)}$.

17. A method of compensating for a distortion in a baseband in-phase (I) signal and a distortion in a corresponding baseband quadrature (Q) signal in an analog distortion compensation circuit, the method comprising:
attenuating the baseband in-phase I signal;
attenuating the baseband Q signal;
performing a plurality of the following calculations based on the attenuated I and Q signals:
calculating a second order intermodulation correction signal IM2 based on $IM2=I^2+Q^2$;
(ii) calculating a second order harmonic correction signal HD2@0° based on $HD2@0°=I^2-Q^2$;
(iii) calculating a second order harmonic correction signal HD2@90° based on $HD2@90°=2IQ$;

(iv) calculating a third order intermodulation correction signal IM3@0° based on IM3@0°=$I^3+Q^2I$;
(v) calculating a third order intermodulation correction signal IM3@90° based on IM3@90°=$I^2Q+Q^3$;
(vi) calculating a third order harmonic correction signal HD3@0° based on HD3@0°=$I^3-3Q^2I$; and
(vii) calculating a third order harmonic correction signal HD3@90° based on HD3@90°=$3I^2Q-Q^3$; and
using a result of the plurality of the calculations to generate an analog I distortion compensation signal at a first output and an analog Q distortion compensation signal at a second output of the signal distortion compensation circuit.

18. The method of claim 17, further comprising using the result of all of the calculations to generate the I distortion compensation signal at the first output and the Q distortion compensation signal at the second output of the signal distortion compensation circuit.

19. The method of claim 17, further comprising scaling each of the at least one calculations, wherein each of the at least one calculations is scaled independently.

20. The method of claim 17, further comprising processing the attenuated I and Q signals differentially.

* * * * *

UNITED STATES PATENT AND TRADEMARK OFFICE
CERTIFICATE OF CORRECTION

PATENT NO. : 9,660,856 B2  
APPLICATION NO. : 14/806492  
DATED : May 23, 2017  
INVENTOR(S) : John Perry Myers Page 1 of 1

It is certified that error appears in the above-identified patent and that said Letters Patent is hereby corrected as shown below:

In the Specification

In Column 4, Line 37 (Approx.), change "$\sin(\omega_1 t - \omega_1 t)$" to --$\sin(\omega_1 t - \omega_2 t)$--

In Column 9, Line 31, change "$^3\sqrt[3]{3}$" to --$^3\sqrt{3}$--

In Column 9, Line 33, change "$^3\sqrt[3]{3}$" to --$^3\sqrt{3}$--

In the Claims

In Column 12, Line 42, Claim 1, before "a second order intermodulation circuit" insert --(i)--

In Column 12, Line 62, Claim 1, change "$3^2Q - Q^3,$" to --$3I^2Q - Q^3,$--

In Column 16, Line 1, Claim 11, change "$3\hat{0}(2/3)Q^2$" to --$3\textasciicircum(2/3)Q^2$--

In Column 16, Line 62, Claim 17, before "calculating" insert --(i)--

In Column 16, Line 65, Claim 17, change "$^2 - Q^2;$" to --$I^2 - Q^2;$--

In Column 17, Line 2, Claim 17, change "$I^3 + Q^2 1;$" to --$I^3 + Q^2 I;$--

In Column 17, Line 6, Claim 17, change "$I^3 - 3Q^2 1;$" to --$I^3 - 3Q^2 I;$--

Signed and Sealed this  
Fifteenth Day of January, 2019

Andrei Iancu  
*Director of the United States Patent and Trademark Office*